(12) United States Patent
Decoutere et al.

(10) Patent No.: US 9,431,511 B2
(45) Date of Patent: Aug. 30, 2016

(54) METHOD FOR PRODUCING A SEMICONDUCTOR DEVICE COMPRISING A SCHOTTKY DIODE AND A HIGH ELECTRON MOBILITY TRANSISTOR

(71) Applicant: IMEC, Leuven (BE)

(72) Inventors: Stefaan Decoutere, Leuven (BE); Silvia Lenci, Linden (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/682,958

(22) Filed: Apr. 9, 2015

(65) Prior Publication Data

US 2015/0214327 A1 Jul. 30, 2015

Related U.S. Application Data

(62) Division of application No. 14/254,615, filed on Apr. 16, 2014.

(51) Int. Cl.
| | |
|---|---|
| *H01L 29/66* | (2006.01) |
| *H01L 27/06* | (2006.01) |
| *H01L 21/8252* | (2006.01) |
| *H01L 29/872* | (2006.01) |
| *H01L 29/778* | (2006.01) |
| H01L 29/06 | (2006.01) |
| H01L 29/10 | (2006.01) |
| H01L 29/20 | (2006.01) |

(52) U.S. Cl.
CPC ..... *H01L 29/66431* (2013.01); *H01L 21/8252* (2013.01); *H01L 27/0605* (2013.01); *H01L 27/0623* (2013.01); *H01L 27/0629* (2013.01); *H01L 29/66143* (2013.01); *H01L 29/66212* (2013.01); *H01L 29/66462* (2013.01); *H01L 29/7783* (2013.01); *H01L 29/7787* (2013.01); *H01L 29/872* (2013.01); H01L 29/0619 (2013.01); H01L 29/1066 (2013.01); H01L 29/2003 (2013.01)

(58) Field of Classification Search
CPC ............... H01L 29/66431; H01L 27/0629; H01L 21/8252; H01L 27/0606; H01L 27/0623; H01L 29/872; H01L 29/66212; H01L 29/66462; H01L 29/7783; H01L 29/7787

See application file for complete search history.

(56) References Cited

U.S. PATENT DOCUMENTS

2012/0146093 A1 6/2012 Shibata et al.

*Primary Examiner* — Long Pham
(74) *Attorney, Agent, or Firm* — McDonnell Boehnen Hulbert & Berghoff LLP

(57) ABSTRACT

A semiconductor device includes a Schottky diode and a High Electron Mobility Transistor (HEMT) formed on a III-nitride stack. The III-nitride stack includes at least a lower and an upper III-nitride layer forming a heterojunction therebetween, so that a 2-dimensional electron gas (2DEG) layer may be formed in the lower layer. The 2DEG layer serves as a charge carrier for the diode and the HEMT. A doped III-nitride layer may be present between a portion of the anode of the diode and the III-nitride stack, and the portion may be located between the diode's Schottky junction and the cathode. A further layer of doped III-nitride material may be present between the gate electrode of the HEMT and the III-nitride stack. The thickness of the III-nitride layers is not equal, so that the turn-on voltage of the diode and the threshold voltage of the HEMT may be tuned according to specific requirements. The disclosure also involves a method of producing such a semiconductor device.

6 Claims, 4 Drawing Sheets

METHOD FOR PRODUCING A SEMICONDUCTOR DEVICE COMPRISING A SCHOTTKY DIODE AND A HIGH ELECTRON MOBILITY TRANSISTOR

CROSS-REFERENCE TO RELATED APPLICATION

This application is a divisional of U.S. patent application Ser. No. 14/254,615 filed on Apr. 16, 2014, which claims priority to European Patent Application No. 13163861.1 filed on Apr. 16, 2013, the contents of which are hereby incorporated by reference.

FIELD OF THE DISCLOSURE

The present disclosure is related to semiconductor processing, in particular to processing of devices comprising a stack of III-nitride layers of different bandgaps, wherein charge carriers move in a 2-dimensional electron gas (2DEG) layer. The disclosure is in particular related to a device comprising a Schottky diode and a High Electron Mobility Transistor (HEMT), and to a method for producing such a device.

BACKGROUND

Metal-semiconductor diodes, also referred to as Schottky diodes are widely used in rectifying circuits because of their low forward voltage drop and fast switching action. Schottky diodes produced on AlGaN/GaN heterostructures benefit from the high breakdown voltage of the GaN and the high mobility and high electron density of the 2DEG layer appearing between the GaN and the AlGaN layer as a result of the difference of piezoelectric and spontaneous polarization. There is, however, the problem of high leakage current when the diode is reverse biased, with high power losses as a consequence. Another problem occurs when a Schottky diode of the above-described type is integrated on one substrate together with a High-Electron-Mobility Transistor (HEMT) that uses the same 2DEG layer for conducting charge. For a power diode, for example, a lower turn-on voltage is desirable, in order to minimize the on-state voltage drop. However, a higher threshold voltage may be desirable for the AlGaN/GaN HEMT, which renders the Schottky diode/HEMT integration difficult.

SUMMARY OF THE DISCLOSURE

The present disclosure is related to a semiconductor device that includes a Schottky diode and a High Electron Mobility Transistor (HEMT) formed on a III-nitride stack that includes at least a lower and an upper III-nitride layer. The lower and upper III-nitride layers form a heterojunction therebetween, so that a 2DEG layer may be formed in the lower of the two III-nitride layers. The 2DEG layer serves as a charge carrier for both the Schottky diode and the HEMT. In the semiconductor device of the disclosure, a doped III-nitride layer may be present between a portion of an anode of the Schottky diode and the III-nitride stack. The portion of the anode being located between the diode's Schottky junction and a cathode of the diode, and a further layer of doped III-nitride material may be present between a gate electrode of the HEMT and the III-nitride stack. In one example, the thicknesses of the III-nitride layers are not equal, so that a turn-on voltage of the diode and a threshold voltage of the HEMT may be tuned according to specific requirements. The disclosure equally involves a method of producing such a semiconductor device.

Generally, the disclosure is related to a semiconductor device that includes a Schottky diode and a High Electron Mobility Transistor, and to a method for producing such a device, as disclosed in the appended claims.

In accordance with an embodiment, the disclosure is related to a semiconductor device that includes a Schottky diode and a High Electron Mobility Transistor. The semiconductor device includes at least a lower and an upper III-nitride layer forming a heterojunction therebetween. A 2DEG layer may be formed in the lower of the two layers. The Schottky diode includes a cathode forming an ohmic contact with the upper III-nitride layer, and an anode that has a first portion that forms a Schottky barrier contact with the upper III-nitride layer and a second portion. The second portion is positioned between the first portion of the anode and the cathode. The diode also includes a dielectric area on the upper III-nitride layer, and the dielectric area isolates the anode and cathode from each other. Further, the diode includes a layer of doped III-nitride material between the second portion of the anode and the upper III-nitride layer. The doped III-nitride material is configured to pinch off the 2DEG layer in the reverse bias region of the diode. The HEMT includes a source electrode and a drain electrode in ohmic contact with the upper III-nitride layer, a gate electrode between the source and drain electrodes, and dielectric areas on the upper III-nitride layer. The dielectric areas of the HEMT being disposed between the source and gate and between the gate and drain. Further, the HEMT includes a layer of doped III-nitride material between the gate electrode and the upper III-nitride layer. The layers of doped III-nitride material in the diode and in the HEMT may have different thicknesses.

According to an embodiment, the thickness of the layer of doped III-nitride material in the HEMT is greater than the thickness of the layer of doped III-nitride material in the Schottky diode.

According to an embodiment, the layers of doped III-nitride material have a length measured in the direction of current flow in the diode and the HEMT, and the length of the layer of doped III-nitride material in the HEMT is less than the length of the layer of doped III-nitride material in the Schottky diode.

Further, the first and second portions of the anode may be separated by a dielectric area. Alternatively, the first and second portions of the anode may be directly adjacent each other.

According to an embodiment, the lower III-nitride layer is a GaN layer, the upper III-nitride layer is an AlGaN layer, and the layers of doped III-nitride material are layers of p-doped GaN or AlGaN.

The disclosure also relate to a method for producing a semiconductor device that includes a Schottky diode and a High Electron Mobility Transistor. According to an embodiment, the method includes producing a III-nitride stack on a carrier substrate. The III-nitride stack includes at least a lower and an upper III-nitride layer forming a heterojunction there between, so that a 2DEG layer may be formed in the lower of the two layers. The method also includes depositing a dielectric layer on the III-nitride stack, and patterning the dielectric layer to form a plurality of openings through the dielectric layer. The plurality of openings correspond to the location of the anode and cathode electrodes of the Schottky diode, and to the location of the source, drain, and gate electrodes of the HEMT. The opening or openings that correspond to the location of the anode, hereafter referred to as "anode-opening(s)," include a first portion that corresponds to the Schottky junction of the diode and a second portion adjacent to the first portion. Each opening of the second portion is located between the first portion and one of the opening or openings corresponding to the cathode electrode. Further, the method includes producing a first layer or layers of a doped III-nitride material in the second portion of the anode-opening(s), and producing a second layer or layers of a doped III-nitride material in the opening or openings that correspond to the gate of the HEMT, hereafter referred to as "gate opening(s)." The thicknesses of the first and second layers of doped III-nitride material are not equal. In addition, the method includes producing the anode and cathode electrodes and the source, gate, and drain electrodes. A portion or portions of the anode being produced on top of the first layer or layers of the doped III-nitride material, and the gate electrode being produced on top of the second layer or layers of the doped III-nitride material. The method also includes producing an isolation area between the diode and the HEMT.

Generally, in the above method, an opening may be considered to be 'corresponding to' the location of an electrode when the opening is configured to receive at least a portion of the electrode metal, either by directly depositing metal in the opening or by depositing first one or more intermediate layers and depositing metal on the intermediate layer(s).

According to an embodiment, producing the first and second layers of the doped III-nitride material is performed by selectively depositing a doped III-nitride material in the second portion of the anode-opening(s) and in the gate opening(s). The selective deposition may take place in a single deposition step, and the dimensions of the second portion of the anode opening(s) and the dimensions of the gate-opening(s) are selected so that the thickness of the obtained first layer(s) are not equal to the thickness of the obtained second layer(s).

According to a further embodiment, the openings of the second portion of the anode-opening(s) and the gate opening(s) have a length, and the length of the gate-opening(s) is smaller than the length of the opening(s) of the second portion of the anode opening(s), so that the thickness of the second layer(s) is higher than the thickness of the first layer(s).

According to another embodiment, producing the first and second layers of a doped III-nitride material is performed by masking the gate opening(s) and depositing the first layer(s) of doped III-nitride material, and masking the opening(s) of the second portion of the anode opening(s) and depositing the second layer(s) of doped III-nitride material.

According to an embodiment of the method, following the depositing of a dielectric layer on the III-nitride stack, the following subsequent steps are performed: forming the second portion of the anode-opening(s), and the gate opening(s) in a first step of patterning the dielectric layer; producing the first and second layer of doped III-nitride material in the second portion of the anode-opening(s), and in the gate opening(s); forming, in a second patterning step, the first portion of the opening(s) corresponding to the location of the anode of the Schottky diode; producing the anode electrode and the gate electrode; forming, in one or more further patterning steps, the openings corresponding to the location of the cathode electrode of the Schottky diode and of the source and drain electrodes of the HEMT; and producing the cathode electrode and the source and drain electrodes.

According to an embodiment, the lower III-nitride layer is a GaN layer, the upper III-nitride layer is an AlGaN layer, and the layers of doped III-nitride material are layers of p-doped GaN or AlGaN.

DETAILED DESCRIPTION OF THE DISCLOSURE

Figure 1:
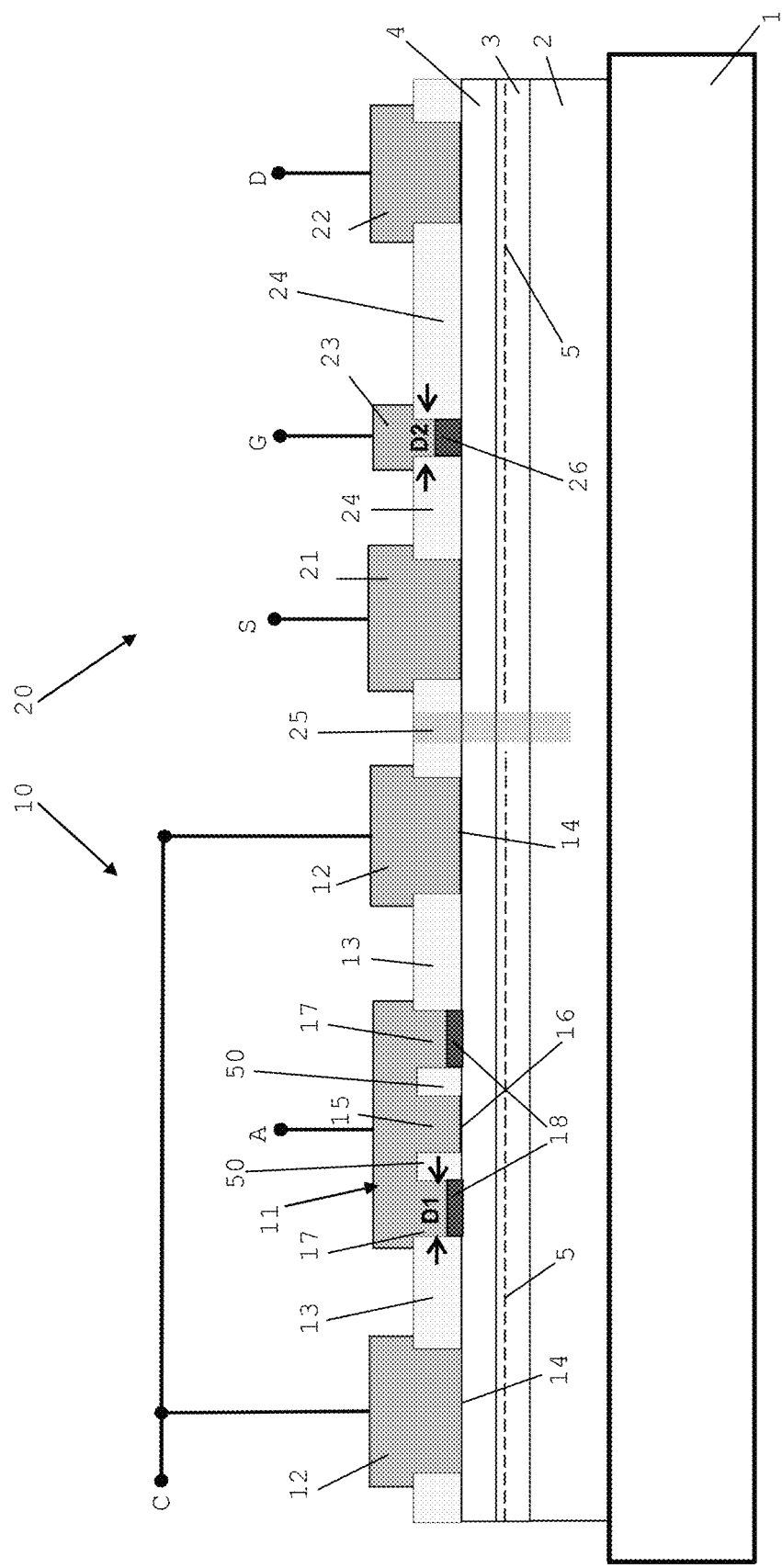
FIG. 1 illustrates the structure of a semiconductor device according to an embodiment of the present disclosure.

In a semiconductor device according to the disclosure, a Schottky power diode and a HEMT are arranged on the same substrate, and on the same stack of III-nitride materials, so as to conduct current via (at least portions of) the same 2DEG layers formed in the stack. In this detailed description, the 2DEG layer is described as formed between a GaN channel layer and an AlGaN barrier layer. Although, other combinations of III-nitride layers may be suitable for the purpose of the disclosure. A device according to the disclosure is shown in FIG. 1. On a base substrate 1, e.g., a Si or Si-carbide substrate, the III-nitride stack is present. The III-nitride stack in FIG. 1 includes one or more buffer layers 2, a GaN channel layer 3, and an AlGaN barrier layer 4. The 2DEG layer 5 is formed at or near the interface between the channel layer and the barrier layer. The buffer layer 2 may include several (Al)GaN layers. Generally, the buffer layer 2 improves the buffer breakdown of the device, minimizes the mismatch between the substrate 1 and the GaN layer 3, and improves the confinement of the 2DEG layer 5 at the AlGaN/GaN interface.

The Schottky diode 10 of FIG. 1 includes a central anode 11 and symmetrically placed and externally interconnected cathodes 12. The anode and cathodes are elongate electrodes of a given width in the direction perpendicular to the drawing in FIG. 1. The anode and cathodes are connected to external terminals A and C, respectively. Instead of separate and externally connected cathode portions 12, the cathode may also be a single electrode surrounding the anode, or the diode may have an asymmetrical structure with one anode and one cathode arranged side by side.

A dielectric layer 13 separates the anode and cathodes electrically from each other. The cathodes 12 are joined to the barrier layer 4 through ohmic contact junction 14. The anode comprises a central portion 15 that is joined to the barrier layer 4 through a Schottky barrier contact junction 16. The anode 11 further comprises lateral portions 17 that are separated from the barrier layer by a layer 18. The layer 18 is a layer of p-doped GaN or p-doped AlGaN (hereinafter referred to as a 'p-GaN layer'). The p-doping means that positive doping elements have been added to the GaN or AlGaN material. The p-doped layer applied in accordance with this embodiment of the disclosure is thus a layer with a higher doping level than an unintentionally doped layer, e.g., a layer containing unintentional impurities (such as oxygen and carbon), which are typically present at a doping level below $10^{13}$ at/cm$^3$, and without intentionally added dopant atoms (typically Mg for positive doping). The effect of the p-doped layer is to deplete the 2DEG layer when the diode is reverse biased, thereby blocking the reverse leakage current, whilst a high current conduction and low on-state voltage is obtained in forward conduction mode, through the Schottky junction 16. The effect of such a laterally placed p-doped region is known in itself, as illustrated for example by US2012/0146093.

The HEMT 20 in FIG. 1 includes source and drain electrodes 21 and 22, respectively, which are in ohmic contact with the barrier layer 4, and a gate electrode 23. The electrodes 21, 22, 23 are connected to external terminals S/D/G, respectively. Dielectric layers 24 isolate the electrodes from each other. A deeper isolation area 25 isolates the diode 10 from the HEMT 20. The gate electrode 23 is separated from the barrier layer 4 by a p-GaN or p-AlGaN layer 26 (hereinafter referred to as a 'p-GaN layer'). The thickness of this layer 26 is different from the thickness of the p-GaN layers 18 provided in the Schottky diode structure. This difference in thickness is characteristic to the disclosure, as it is related to the turn-on voltage of the diode and the threshold voltage of the HEMT. By tuning these thicknesses in a suitable way, optimized turn-on and threshold voltages of the diode and HEMT, respectively, can be obtained.

In the embodiment illustrated in FIG. 1, the p-GaN layer 26 at the HEMT gate has a greater thickness than the p-GaN layers 18 of the diode, thereby obtaining a predefined threshold voltage of the HEMT in accordance with the operative requirements of the HEMT device (conducting above a given gate bias voltage), while the turn-on voltage of the diode is lower due to a thinner p-GaN layer 18.

The p-GaN layer 18 shields the Schottky Barrier Diode from high reverse electric fields, by pinching off the channel when the anode-to-cathode voltage is lower than the turn-on voltage. Similarly, the p-GaN area 26 can pinch-off the transistor channel and allow transistor turn-off when the gate-to-source voltage is lower than the threshold voltage. Since the diode is a shorted connection in the on-state, a turn-on voltage as close as possible to zero may be selected for the diode. However, a positive threshold voltage is generally selected for the transistor, which shows enhancement-mode behaviour (e.g., no 2DEG layer is present underneath the gate 23 unless a positive voltage is applied between the gate and source). Thus, the diode turn-on voltage may be selected to be lower than the transistor threshold voltage. In both cases, it is possible to tune the turn-on/threshold voltage by modifying the p-GaN thickness. More particularly, increasing the p-GaN layer thickness results in a positive shift of turn-on/threshold voltage.

In the embodiment of FIG. 1, all of the electrodes, p-GaN layers, and dielectric isolation layers are shaped as elongate portions having a given width measured in the direction perpendicular to the drawing in FIG. 1, and a given length in the plane of drawing and perpendicular to the width. Generally, the term 'length' is used as this particular dimension corresponds to the direction of current flow in the respective devices 10 and 20. As shown in FIG. 1, the length D2 of the layer 26 is less than the length D1 of the layers 18. This aspect of the length of the layers 18, 26 is related to the method for producing a semiconductor device according to the disclosure, as described hereafter.

In general terms, the method of the disclosure for producing the device shown in FIG. 1 (with an AlGaN/GaN stack and layers 18 and 26 referred to as 'p-GaN layers', although the method is not limited to these particular combinations), includes the following steps, illustrated in FIGS. 2a-2i:

Producing a III-nitride stack 2, 3, 4, as described above, on a carrier substrate 1. The production of such a III-nitride stack can be accomplished according to any suitable technique known in the art, e.g., by Metal Organic Chemical Vapour Deposition (MOCVD). As shown in FIG. 1, the barrier layer 4 forms the top layer of the III-nitride stack.

Depositing a dielectric layer 30 on the III-nitride stack, for example a $Si_3N_4$ layer deposited in-situ (in the same process chamber as the III-nitride stack deposition) and, for example, by the same deposition process as the III-nitride stack. The dielectric layer may include several layers deposited sequentially.

Patterning (e.g., by one or more standard litho/etch steps) the dielectric layer 30 to form a plurality of openings 31-36 through the dielectric layer. The plurality of openings corresponding to the locations 31-33 of the anode and cathode electrodes of the Schottky diode 10, and to the locations 34-36 of the source, gate, and drain electrodes of the HEMT 20. The opening or openings corresponding to the anode include a first portion 31 corresponding to the Schottky junction of the diode and at least one second portion 32 adjacent to the first portion, and located between the first portion 31 and the opening or openings 33 corresponding to the cathode. These openings may not be patterned in one litho/etch step, but in a series of such steps as disclosed further in this description.

Producing a first layer 18 of p-GaN in the second portion 32 of the anode-opening or openings, and producing a second layer of p-GaN 26 in the opening or openings 35 corresponding to the gate of the HEMT. The thicknesses of the first and second layers may be unequal.

Producing the electrodes, for example, by depositing electrically conductive layers and patterning the layers. A portion of the anode 11 being produced on top of the first p-GaN layer 18 and the gate electrode 23 being produced on top of the second p-GaN layer 26. Again, all of the electrodes may not be produced in a single step, but some electrodes may be produced after one or more first litho/etch steps, with other electrodes being produced after further litho/etch steps, as described in the case of an embodiment of this disclosure.

Producing an isolation area 25 between the diode and the HEMT. The isolation area can be produced, for example, by a mesa etch technique.

The production of the p-GaN layers 18 and 26 can be performed by a deposition step of a GaN layer with in-situ doping, e.g., positive doping elements, such as Mg, are deposited during the GaN deposition step. At least one of the openings 32 and 35 wherein the first and second p-GaN layer 18, 26 are to be deposited can be extended in the III-nitride stack, thereby recessing partially an upper III-nitride layer of the III-nitride stack.

Figure 2A:
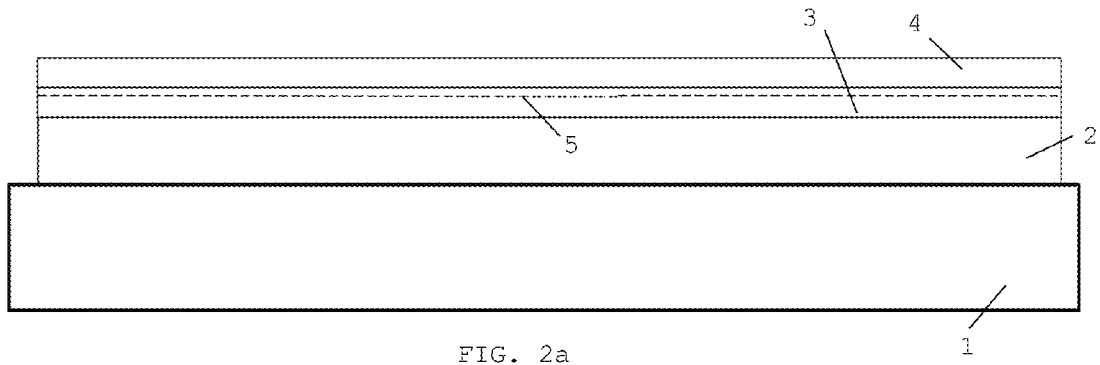
FIGS. 2a-2i illustrate steps in a method according to an embodiment the disclosure.
Figure 2B:
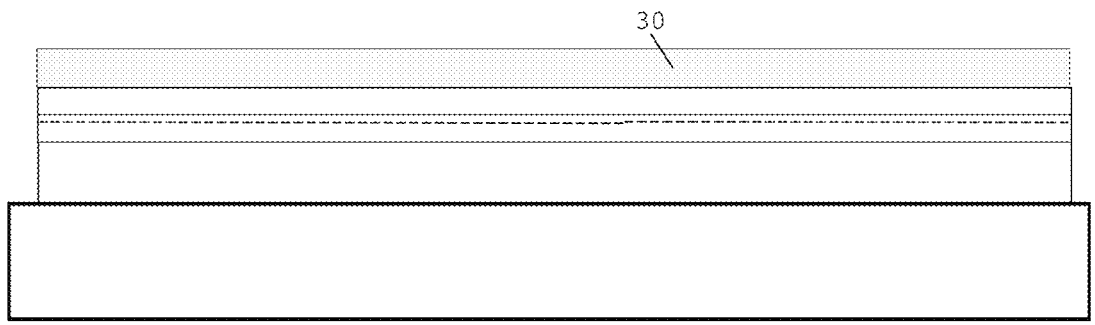
Figure 2C:
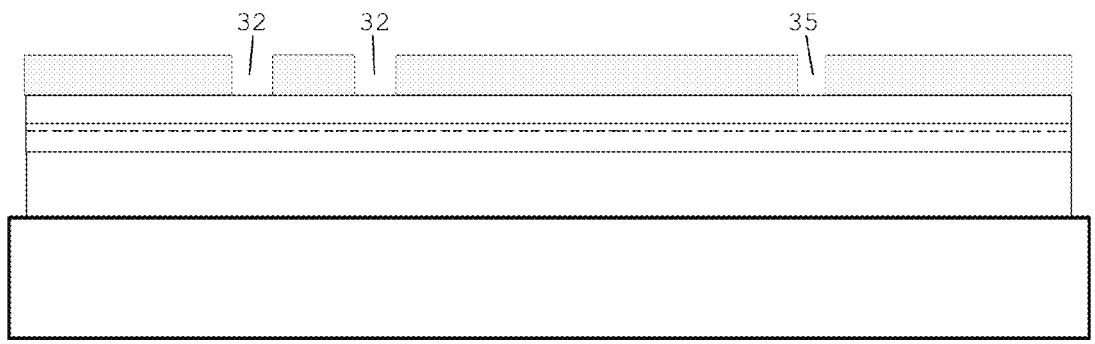
Figure 2D:
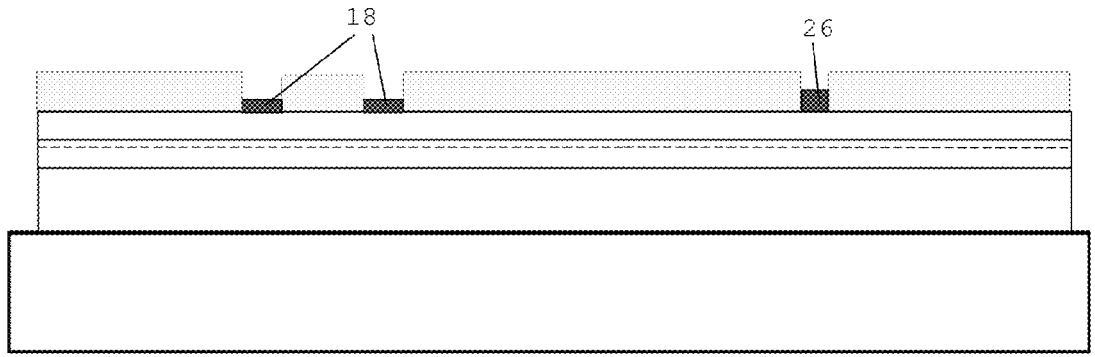
Figure 2E:
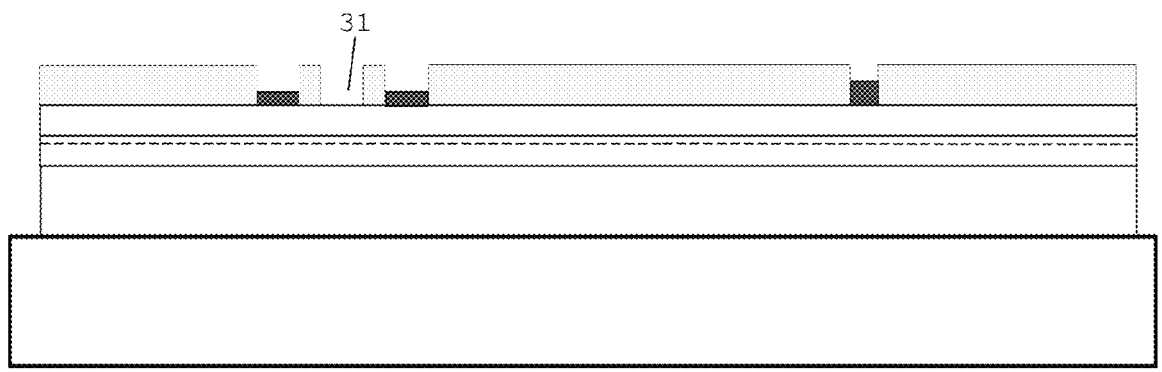
Figure 2F:
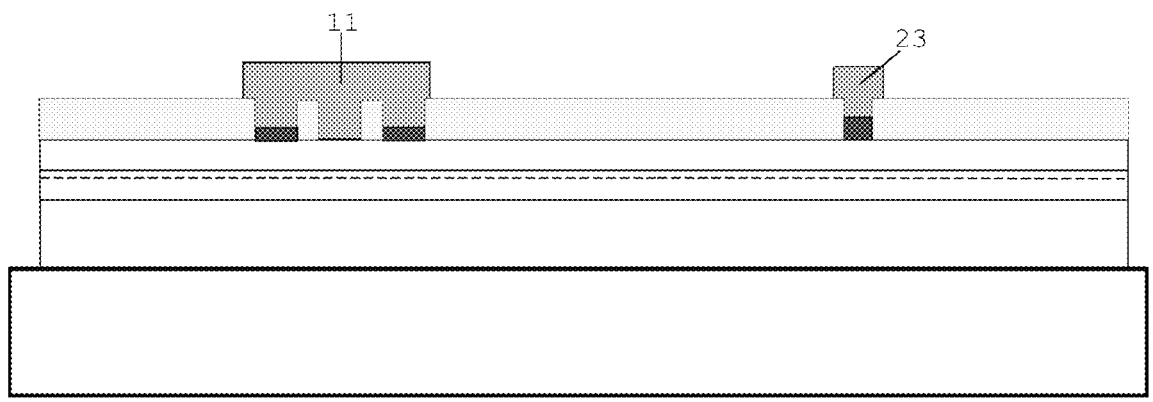
Figure 2G:
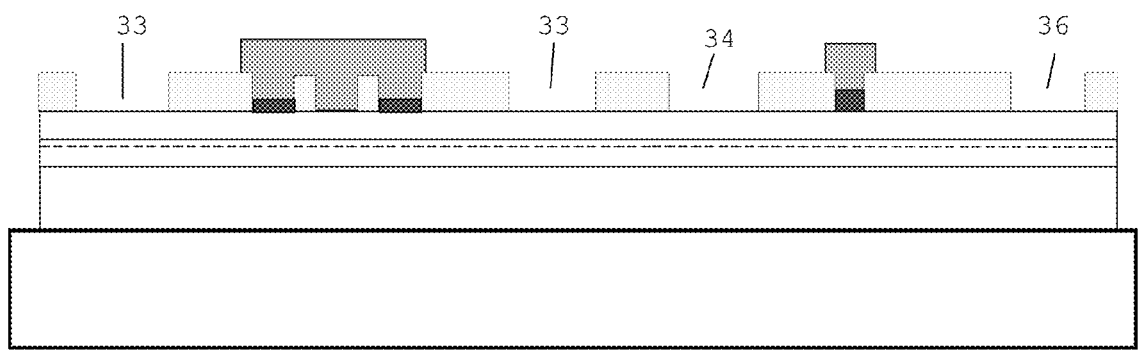
Figure 2H:
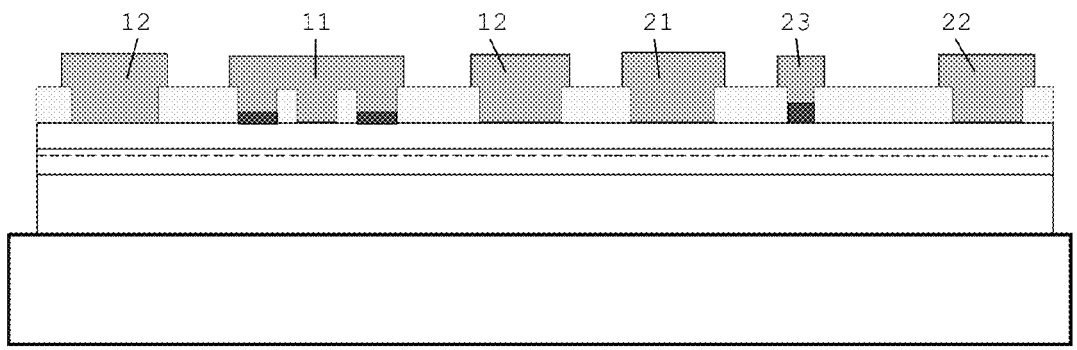
Figure 2I:
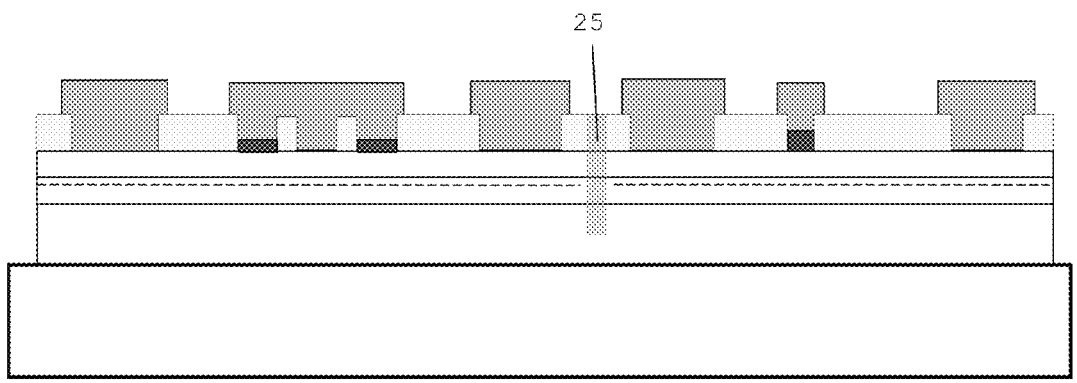

According to the embodiment illustrated in FIGS. 2a-2i, the openings 31-36 may not be etched at the same time, nor may all the electrodes be formed simultaneously. In the illustrated embodiment, the openings 32 and 35 are formed first (FIG. 2c), followed by the deposition of the p-GaN layers 18, 26 (FIG. 2d). Then, opening 31 is formed (FIG. 2e), followed by the deposition of electrodes 11 and 23, which can be made of different metals (FIG. 2f). Then a second litho/etch is performed for forming the openings 33, 34, 36 (FIG. 2g). This is followed by the production of the cathode electrode 12 and the source and drain electrodes 21, 22 in the respective openings (FIG. 2h), and the formation of the isolation area 25 (FIG. 2i).

According to an embodiment, the step of producing the first and second p-GaN layers 18, 26 may be performed in a single step, by selective deposition of the p-GaN in the openings 32, 35 corresponding to the second anode portion and the HEMT gate. The selective deposition may be performed according to the known SAG technique (Selective Area Growth), with the dielectric layer 30 acting as the SAG mask.

When the p-GaN layers 18, 26 are deposited by simultaneous selective deposition as described above, the length D1 and D2 of the openings 32 and 35 is designed to obtain different thicknesses of the layers 18, 26. When the length of the opening is chosen to be relatively narrower, the thickness of a selectively deposited p-GaN layer is thicker than the p-GaN deposited in a relatively wider opening due to a loading effect during selective deposition. This tuning of the p-GaN thickness by a well-considered design of the dimensions of the openings is novel. Experiments have revealed that selective p-GaN deposition simultaneously in a trench of 10 μm in length and in a trench of 500 nm in length, the trenches being produced in a $Si_3N_4$ layer, leads to a p-GaN layer of about 35 nm thick in the wider trench and about 70 nm thick in the narrower trench. This difference is sufficient for obtaining a shift of about 1V in the threshold voltage of the HEMT compared to the case where the thickness of the p-GaN layer would be 35 nm both in the diode and in the HEMT. By adequately designing the length of the respective openings, it becomes possible to tune the turn-on and threshold voltages while the p-GaN layers in the diode and HEMT are produced in a single step.

Even though this embodiment involves the above-described single-step selective deposition of the p-GaN layers 18, 26 in suitably sized openings, these p-GaN layers can be obtained by other methods as well. For example, the layers 18 may be deposited first (by a suitable technique known in the art, and possibly with in-situ doping) through a mask that shields the opening corresponding to the HEMT gate, followed by the deposition of the layer 26 through a second mask shielding the diode area. In this embodiment, a predefined thickness of each respective p-GaN layers can be produced independently from the other. This embodiment does not require a different size of the respective openings. However, this embodiment may be more complex in that it requires multiple masking steps.

Another embodiment includes the deposition of p-GaN layers 18, 26 of the same thickness, followed by etching back one of the layers to reduce it in thickness. This may also be a more complex method involving masking steps.

The structure shown in FIG. 1 includes active areas (such as anode, cathode, and S/G/D electrodes) and separating isolation areas (such as areas 13, 24, 25) of a given length. FIG. 1 shows only one electrode of each type (except the cathode), but the device may consist of several electrode 'fingers' interconnected laterally by contact pads. The disclosure is furthermore not limited to this elongate shape of the electrodes but can be implemented in any other device structure.

The disclosure is not limited to the symmetric diode structure shown in FIG. 1, with a central anode and two cathodes. The diode may have one anode and one cathode with the p-GaN area 18 between the Schottky junction 16 of the diode and the ohmic junction 14 of the cathode.

The disclosure is furthermore not limited to the anode-structure shown in FIG. 1, wherein the Schottky junction 16 is separated from the p-GaN layers 18 by a dielectric area 50. In an alternative embodiment, the p-GaN layer 18 may be directly adjacent and in contact with the Schottky junction 16.

While the disclosure has been illustrated and described in detail in the drawings and foregoing description, such illustration and description are to be considered illustrative or exemplary and not restrictive. Other variations to the disclosed embodiments can be understood and effected by those skilled in the art in practicing the claimed disclosure, from a study of the drawings, the and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be advantageously used. Further, any reference signs in the claims should not be construed as limiting the scope.

The foregoing description details certain embodiments of the disclosure. It will be appreciated, however, that no matter how detailed the foregoing appears in text, the disclosure may be practiced in many ways, and is therefore not limited to the embodiments disclosed. It should be noted that the use of particular terminology when describing certain features or aspects of the disclosure should not be taken to imply that the terminology is being re-defined herein to be restricted to include any specific characteristics of the features or aspects of the disclosure with which that terminology is associated.

Unless specifically specified, the description of a layer being deposited or produced 'on' another layer or substrate, includes the options of the layer being produced or deposited directly on, e.g., in contact with, the other layer or substrate, and the layer being produced on one or a stack of intermediate layers between the layer and the other layer or substrate.

The invention claimed is:

1. A method for producing a semiconductor device that includes a Schottky diode and a High Electron Mobility Transistor (HEMT), the method comprising:
   producing a III-nitride stack on a carrier substrate, the stack including at least a lower III-nitride layer and an upper III-nitride layer forming a heterojunction therebetween, wherein a 2-dimensional electron gas (2DEG) layer may be formed in the lower III-nitride layer;
   depositing a dielectric layer on the III-nitride stack;
   patterning the dielectric layer to form a plurality of openings through the dielectric layer, wherein the openings correspond to locations of anode and cathode electrodes of the Schottky diode and to locations of source, drain, and gate electrodes of the HEMT, wherein one or more of the openings are anode-openings that correspond to the location of the anode electrode, wherein the one or more anode-openings include a first portion corresponding to a Schottky junction of the Schottky diode and a second portion that is adjacent to the first portion, and wherein each opening of the second portion is located between the first portion and one of one or more openings that correspond to the cathode electrode;
   producing one or more first layers of a doped III-nitride material in the second portion of the one or more anode-openings, and producing one or more second layers of a doped III-nitride material in the one or more gate-openings that correspond to the gate electrode of the HEMT, wherein thicknesses of the first and second layers of doped III-nitride are not equal;
   producing the anode and cathode electrodes and the source, gate, and drain electrodes, wherein one or more portions of the anode are produced on top of the one or more first layers of the doped III-nitride material, and wherein the gate electrode is produced on top of the one or more second layers of the doped III-nitride material; and producing an isolation area between the Schottky diode and the HEMT.

2. The method according to claim 1, wherein producing the one or more first and second layers of the doped III-nitride material is performed by selectively depositing a doped III-nitride material in the second portion of the one or more anode-opening, and in the one or more gate-openings, wherein the selective deposition takes place in a single deposition step, and wherein dimensions of the second portion of the one or more anode openings and dimensions of the one or more gate-openings are selected so that the thickness of the obtained one or more first layers is not equal to the thickness of the obtained one or more second layers.

3. The method according to claim 2, wherein openings of the second portion of the one or more anode-openings and the one or more gate-openings have a length, and wherein the length of the one or more gate-openings is smaller than the length of the one or more openings of the second portion of the one or more anode-openings, so that a thickness of the one or more second layers is greater than a thickness of the one or more first layers.

4. The method according to claim 1, wherein producing the one or more first and second layers of the doped III-nitride material is performed by:

masking the one or more gate-openings, and depositing the one or more first layers of the doped III-nitride material; and masking the one or more openings of the second portion of the anode-openings, and depositing the one or more second layers of the doped III-nitride material.

5. The method according to claim 1, wherein following the depositing of the dielectric layer on the III-nitride stack, the following subsequent steps are performed:

forming the second portion of the one or more anode-openings and the one or more gate-openings in a first step of patterning the dielectric layer;

producing the first and second layers of doped III-nitride material in the second portion of the one or more anode-openings and in the one or more gate-openings, respectively;

forming, in a second patterning step, the first portion of the one or more openings corresponding to the location of the anode of the Schottky diode;

producing the anode electrode and the gate electrode;

forming, in one or more further patterning steps, the openings corresponding to the locations of the cathode electrode of the Schottky diode and of the source and drain electrodes of the HEMT; and producing the cathode electrode and the source and drain electrodes.

6. The method according to claim 1, wherein the lower III-nitride layer is a GaN layer, the upper III-nitride layer is an AlGaN layer, and the first and second layers of doped III-nitride material are layers of p-doped GaN or AlGaN.

* * * * *